US012598918B2

(12) United States Patent
Sasaki et al.

(10) Patent No.: US 12,598,918 B2
(45) Date of Patent: Apr. 7, 2026

(54) MAGNETO-RESISTIVE ELEMENT AND METHOD OF MANUFACTURING THE MAGNETO-RESISTIVE ELEMENT

(71) Applicant: TDK CORPORATION, Tokyo (JP)

(72) Inventors: Tomoyuki Sasaki, Tokyo (JP); Zhenyao Tang, Tokyo (JP)

(73) Assignee: TDK CORPORATION, Tokyo (JP)

( * ) Notice: Subject to any disclaimer, the term of this patent is extended or adjusted under 35 U.S.C. 154(b) by 559 days.

(21) Appl. No.: 17/971,775

(22) Filed: Oct. 24, 2022

(65) Prior Publication Data

US 2023/0389444 A1 Nov. 30, 2023

(30) Foreign Application Priority Data

May 25, 2022 (WO) ................. PCT/JP2022/021362
May 26, 2022 (WO) ................. PCT/JP2022/021656

(51) Int. Cl.
  H10N 50/80 (2023.01)
  H10B 61/00 (2023.01)
  H10N 50/01 (2023.01)
  H10N 50/10 (2023.01)
  H10N 50/85 (2023.01)

(52) U.S. Cl.
  CPC ............. H10N 50/80 (2023.02); H10B 61/22 (2023.02); H10N 50/01 (2023.02); H10N 50/10 (2023.02); H10N 50/85 (2023.02)

(58) Field of Classification Search
  CPC ......................................... H10N 50/00–50/85
  See application file for complete search history.

(56) References Cited

U.S. PATENT DOCUMENTS

| | | | |
|---|---|---|---|
| 8,836,000 B1 | 9/2014 | Lin | |
| 9,184,375 B1 | 11/2015 | Tang et al. | |
| 9,590,010 B1 * | 3/2017 | Gottwald ............... | H10N 50/10 |
| 10,224,067 B2 | 3/2019 | Sasaki | |
| 10,522,592 B2 | 12/2019 | Sasaki et al. | |
| 10,564,229 B2 | 2/2020 | Sasaki | |
| 10,573,449 B2 | 2/2020 | Sasaki | |
| 11,264,290 B2 | 3/2022 | Sasaki | |
| 2004/0188732 A1 * | 9/2004 | Fukuzumi .............. | B82Y 10/00 |
| | | | 257/E27.005 |
| 2008/0304353 A1 | 12/2008 | Abraham et al. | |
| 2011/0089511 A1 | 4/2011 | Keshtbod et al. | |
| 2011/0260272 A1 | 10/2011 | Lee et al. | |
| 2012/0091548 A1 | 4/2012 | Sukegawa et al. | |
| 2013/0010532 A1 | 1/2013 | Nagase et al. | |

(Continued)

FOREIGN PATENT DOCUMENTS

| | | |
|---|---|---|
| JP | 2004-349671 A | 12/2004 |
| JP | 2013-16644 A | 1/2013 |

(Continued)

*Primary Examiner* — Kevin Parendo
(74) *Attorney, Agent, or Firm* — Oliff PLC

(57) ABSTRACT

A magneto-resistive element includes a first ferromagnetic layer, a second ferromagnetic layer, and a non-magnetic layer. The non-magnetic layer is located between the first ferromagnetic layer and the second ferromagnetic layer. The non-magnetic layer includes a first central region, and a first outer circumferential region disposed on an outer side of the first central region. A maximum thickness of the first outer circumferential region is greater than an average thickness of the first central region.

19 Claims, 9 Drawing Sheets

(56) References Cited

U.S. PATENT DOCUMENTS

| | | |
|---|---|---|
| 2013/0221461 A1 | 8/2013 | Sukegawa et al. |
| 2014/0264513 A1 | 9/2014 | De Brosse et al. |
| 2014/0264673 A1* | 9/2014 | Kitagawa ............... H10B 61/22 |
| | | 257/421 |
| 2015/0171315 A1 | 6/2015 | Gan et al. |
| 2016/0233417 A1 | 8/2016 | Lee et al. |
| 2019/0178956 A1 | 6/2019 | Sasaki |
| 2020/0082857 A1* | 3/2020 | Eeh ........................ H10B 61/22 |
| 2020/0194311 A1 | 6/2020 | Tang et al. |
| 2021/0020216 A1* | 1/2021 | Shiokawa .............. H10B 61/00 |

FOREIGN PATENT DOCUMENTS

| | | |
|---|---|---|
| JP | 5586028 B2 | 9/2014 |
| JP | 2015-156501 A | 8/2015 |
| JP | 5988019 B2 | 9/2016 |
| JP | 2016-219698 A | 12/2016 |
| WO | 2006/006630 A1 | 1/2006 |
| WO | 2019/077663 A1 | 4/2019 |

* cited by examiner

MAGNETO-RESISTIVE ELEMENT AND METHOD OF MANUFACTURING THE MAGNETO-RESISTIVE ELEMENT

CROSS-REFERENCE TO RELATED APPLICATION

Priority is claimed on PCT/JP2022/021656 filed with the International Bureau of WIPO on May 26, 2022, and PCT/JP2022/021362 filed with International Bureau of WIPO on May 25, 2022, the contents of which are incorporated herein by reference.

BACKGROUND

Field of the Invention

The present invention relates to a magneto-resistive element and a method of manufacturing the magneto-resistive element.

Description of Related Art

A magneto-resistive element is an element in which a resistance value in a laminating direction changes due to a magneto-resistive effect. The magneto-resistive element includes two ferromagnetic layers, and a non-magnetic layer sandwiched therebetween. The magneto-resistive element in which a conductor is used for the non-magnetic layer is referred to as a giant magneto-resistance (GMR) element, and the magneto-resistive element in which an insulating layer (a tunnel barrier layer, a barrier layer) is used for the non-magnetic layer is referred to as a tunnel magneto-resistance (TMR) element.

The magneto-resistive element can be applied to various applications such as a magnetic sensor, high frequency parts, a magnetic head, a non-volatile random access memory (MRAM), and the like (for example, Patent Documents 1 and 2). For example, Patent Document 3 discloses a method of controlling an orientation of magnetization using a spin transfer torque (STT) generated by flowing current in a laminating direction of a magneto-resistive element. This method is referred to as a spin injection magnetization inversion method.

PATENT DOCUMENTS

[Patent Document 1]
Japanese Patent No. 5586028
[Patent Document 2]
Japanese Patent No. 5988019
[Patent Document 3]
Japanese Unexamined Patent Application, First Publication No. 2015-156501

SUMMARY

A magneto-resistive element has a resistance value that changes according to a change in relative angle between the magnetization of a first ferromagnetic layer and the magnetization of a second ferromagnetic layer. When the first ferromagnetic layer and the second ferromagnetic layer are short-circuited, an unexpected current path is formed, and a large amount of energy is required to invert the magnetization of the ferromagnetic layer. In addition, the short circuit between the first ferromagnetic layer and the second ferromagnetic layer decreases reliability of the magneto-resistive element.

In consideration of the above-mentioned circumstances, the present disclosure is directed to providing a magneto-resistive element with excellent reliability.

The present disclosure provides the following means in order to solve the above-mentioned problems.

(1) A magneto-resistive element according to a first aspect includes a first ferromagnetic layer, a second ferromagnetic layer, and a non-magnetic layer. The non-magnetic layer is located between the first ferromagnetic layer and the second ferromagnetic layer. The non-magnetic layer includes a first central region, and a first outer circumferential region disposed on an outer side of the first central region. A maximum thickness of the first outer circumferential region is greater than an average thickness of the first central region.

The magneto-resistive element according to the present invention is excellent in reliability.

DETAILED DESCRIPTION

Figure 1:
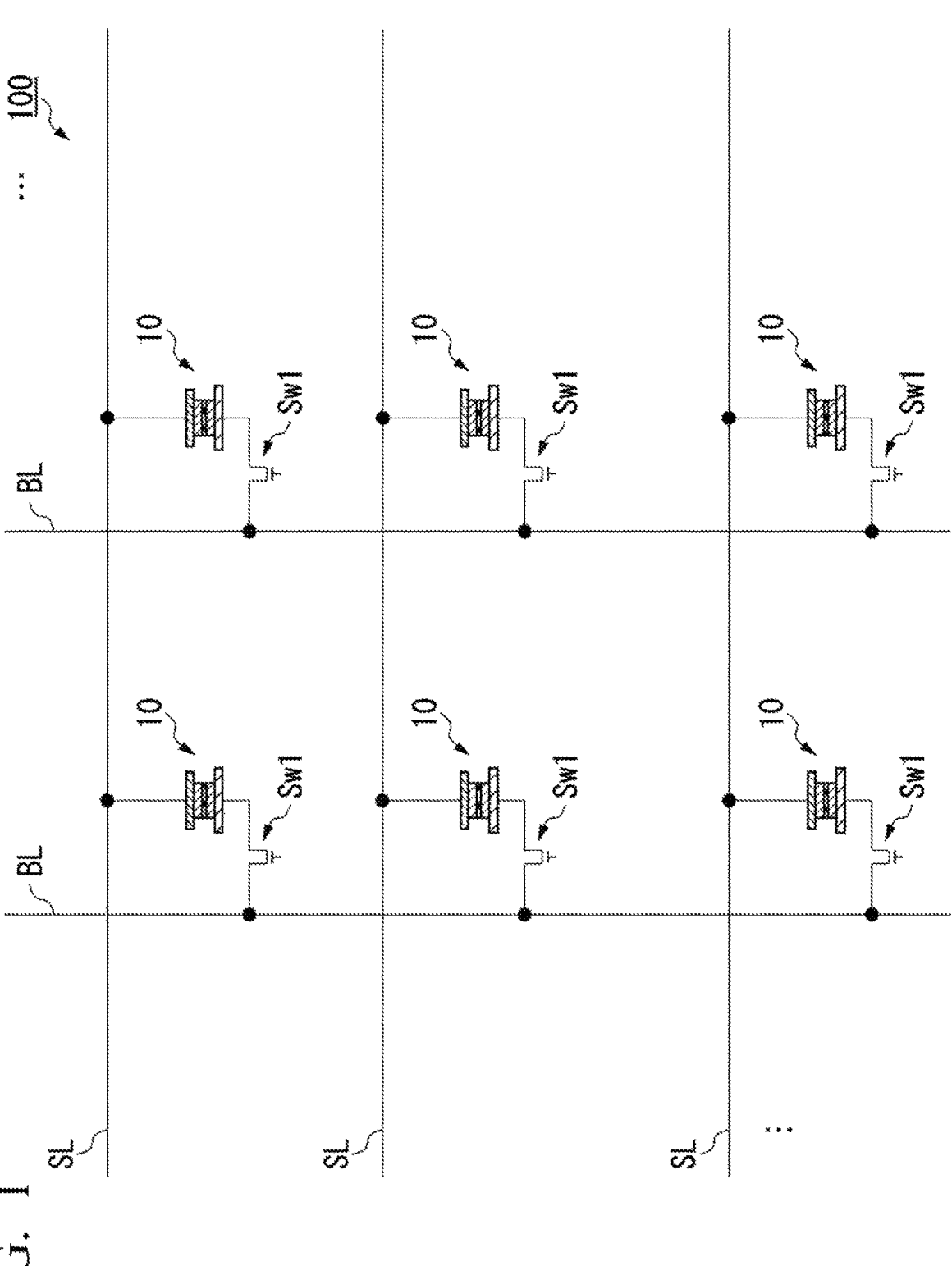
FIG. 1 is a circuit diagram of a magnetic memory according to a first embodiment.

Hereinafter, embodiments will be described in detail with reference to the accompanying drawings as appropriate. In the drawings used in the following description, in order to make features easier to understand, characteristic portions may be enlarged for convenience, and dimensional ratios or the like of components may differ from the actual ones. Materials, dimensions, or the like, exemplified in the following description are examples, and the present invention is not limited to these embodiments and may be variously modified and performed within a range as long as effects of the present invention are exhibited.

First, directions will be defined. A direction of one surface of a substrate Sub (see FIG. 2), which will be described below, is referred to as an x direction, and a direction perpendicular to the x direction is referred to as a y direction. A z direction is a direction perpendicular to the x direction and the y direction. The z direction is an example of a laminating direction in which layers are laminated. Hereinafter, a +z direction may be expressed as "upward" or a −z direction may be expressed as "downward." Upward and downward do not necessarily coincide with the direction in which gravity applies.

In the specification, "connection" is not limited to the case of physical connection. For example, "connection" is not limited to the case in which two layers are physically connected to each other, and also includes the case in which the two layers are connected with another layer sandwiched therebetween. In addition, "connection" in the specification includes electrical connection.

First Embodiment

FIG. 1 is a configuration view of a magnetic memory 100 according to a first embodiment. The magnetic memory 100 includes a plurality of magneto-resistive elements 10, a plurality of source lines SL, a plurality of bit lines BL, and a plurality of first switching elements Sw1.

The magneto-resistive elements 10 are arranged, for example, in a matrix. Each of the magneto-resistive elements 10 is connected to the source line SL and the bit line BL. The source line SL electrically connect a power supply and one or more magneto-resistive elements 10. The bit line BL electrically connect a reference potential and one or more magneto-resistive elements 10. The reference potential is, for example, the ground. The power supply is connected to the magnetic memory 100 when used.

A flow of the current to the magneto-resistive elements 10 is controlled by the first switching elements Sw1. For example, when a specific first switching element Sw1 is turned ON, writing and reading of data on/from the magneto-resistive element 10 connected to the first switching element Sw1 are performed. The magneto-resistive element 10 perform writing of data using a spin transfer torque as the current flows in the laminating direction.

The first switching element Sw1 is an element configured to control a flow of current. The first switching element Sw1 is a transistor, an element using a phase change of a crystalline layer such as an ovonic threshold switch (OTS), an element using a change of a band structure such as a metal insulator transition (MIT) switch, an element using a breakdown voltage such as a Zener diode and an avalanche diode, or an element having conductivity that changes according to a change of an atom position.

Figure 2:
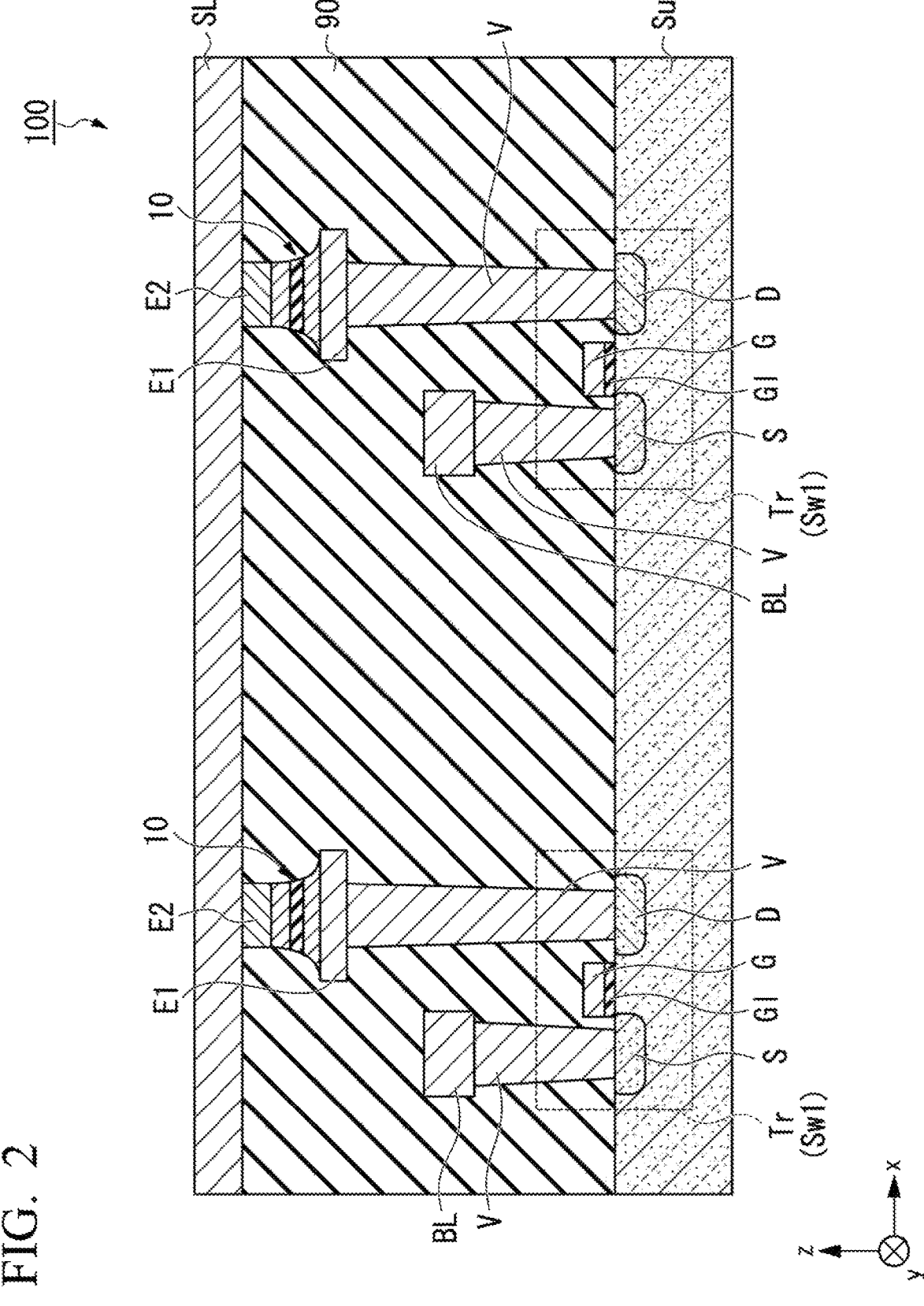
FIG. 2 is a cross-sectional view of a characteristic portion of the magnetic memory according to the first embodiment.

FIG. 2 is a cross-sectional view of a characteristic portion of the magnetic memory 100 according to the first embodiment. The first switching element Sw1 shown in FIG. 2 is a transistor Tr. The transistor Tr is, for example, a field effect type transistor, and has a gate electrode G, a gate insulating film GI, and a source S and a drain D formed on a substrate Sub. The source S and the drain D are defined by a flow direction of current, and they are the same region. A positional relation between the source S and the drain D may be inverted. The substrate Sub may be, for example, a semiconductor substrate.

The transistor Tr and the magneto-resistive element 10 are electrically connected via a via wiring V and an electrode E1. In addition, the transistor Tr and the bit line BL are connected via the via wiring V. The via wiring V extends, for example, in the z direction. The source line SL is connected to the magneto-resistive element 10 via an electrode E2. The via wiring V, the electrode E1 and the electrode E2 contain a material having conductivity. The via wiring V and the electrode E1 may be integrated with each other. In addition, the source lines SL and the electrode E2 may be integrated with each other. That is, the electrode E1 may be a part of the via wiring V, and the electrode E2 may be a part of the source line SL.

Surroundings of the magneto-resistive elements 10 are covered with an insulating layer 90. The insulating layer 90 is an insulating layer that insulates wirings of the multilayer wiring or elements. The insulating layer 90 is, for example, silicon oxide ($SiO_x$), silicon nitride ($SiN_x$), silicon carbide (SiC), chromium nitride, silicon carbon nitride (SiCN), silicon oxynitride (SiON), aluminum oxide ($Al_2O_3$), zirconium oxide ($ZrO_x$), magnesium oxide (MgO), aluminum nitride (AlN), or the like.

Figure 3:
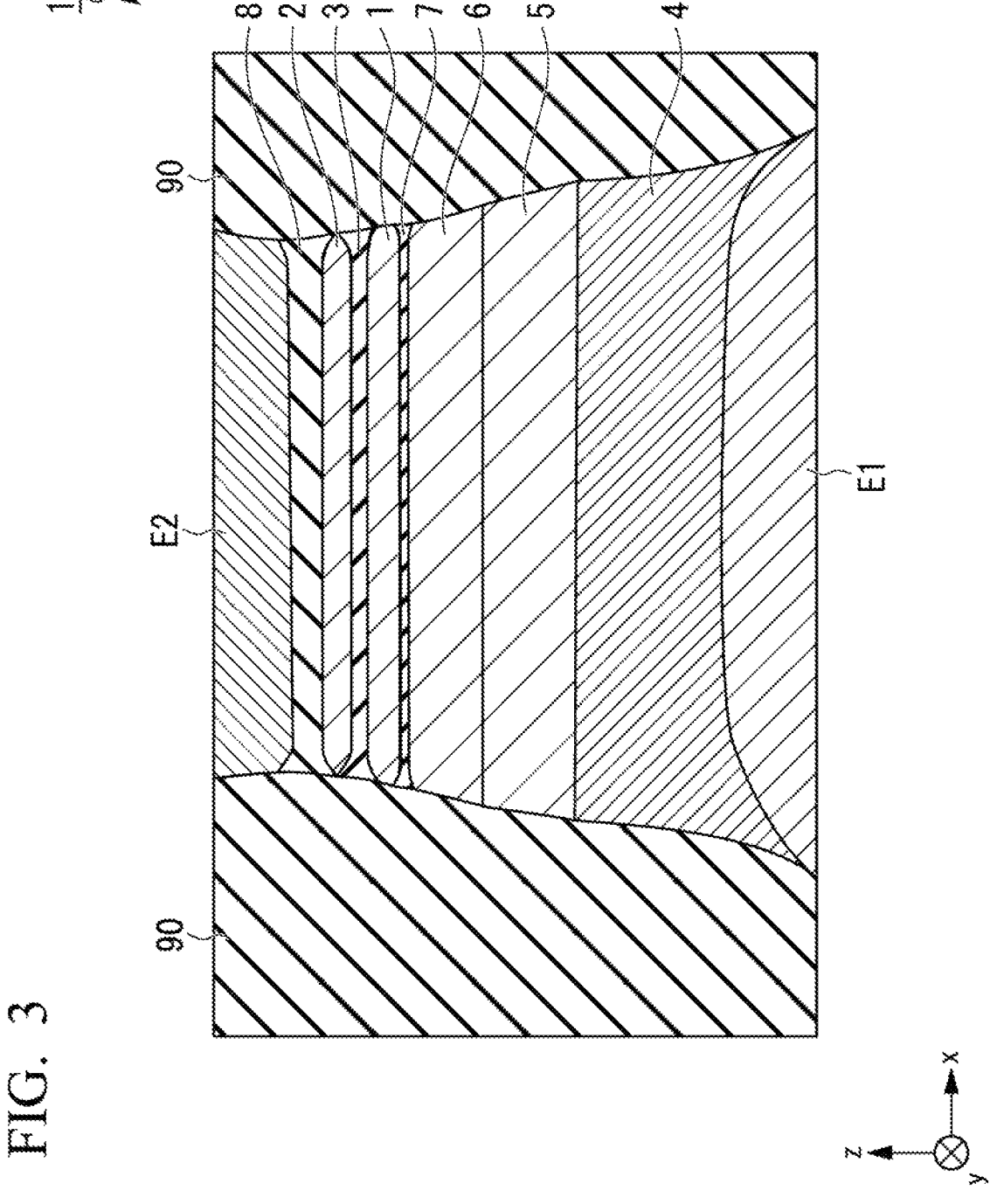
FIG. 3 is a cross-sectional view of a magneto-resistive element according to the first embodiment.
Figure 4:
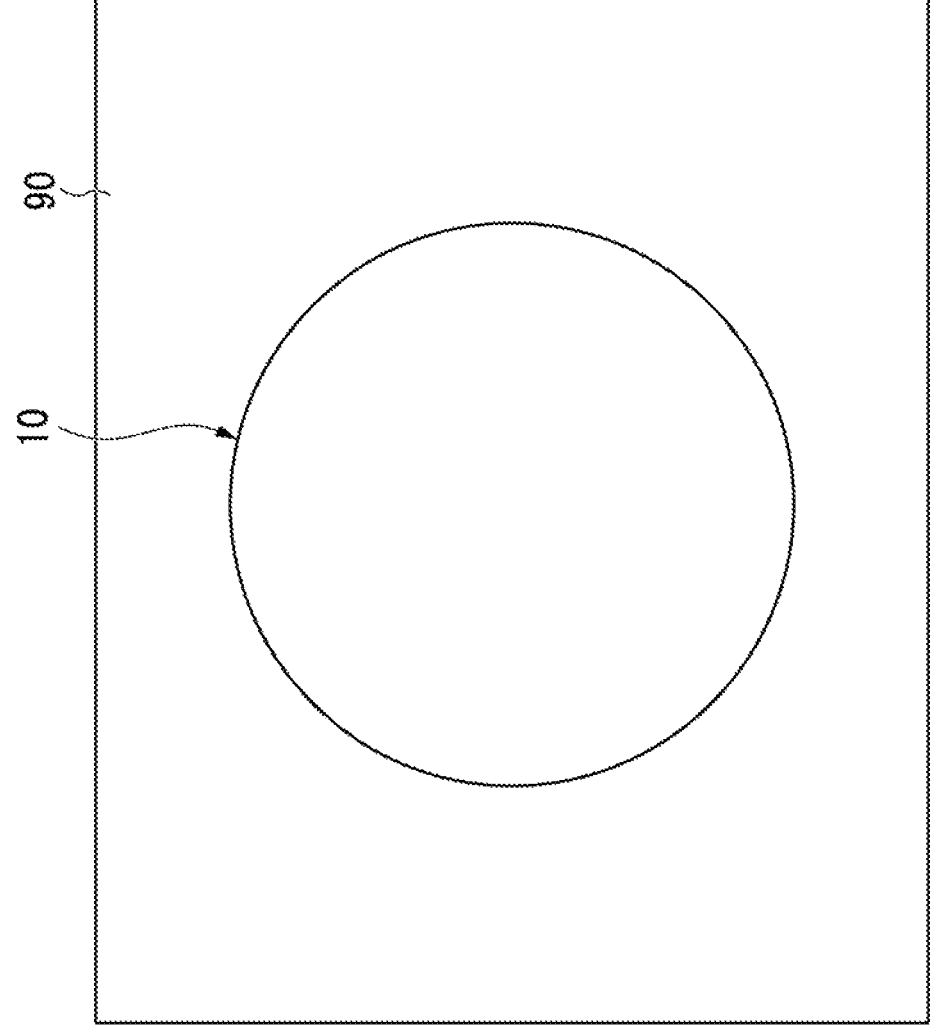
FIG. 4 is a plan view of the magneto-resistive element according to the first embodiment.
Figure 4:
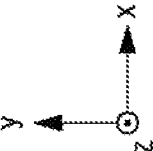

FIG. 3 is a cross-sectional view of the magneto-resistive element 10. FIG. 3 shows a cross section of the magneto-resistive element 10 along an xz plane passing through a center of the magneto-resistive element 10. FIG. 4 is a plan view of the magneto-resistive element 10 when seen in the z direction. In FIG. 3 and FIG. 4, the insulating layer 90 that covers surroundings the magneto-resistive element 10 is also shown.

The magneto-resistive element 10 is an element configured to record and store the data. The magneto-resistive element 10 records data in resistance values in the z direction. The resistance value of the magneto-resistive element 10 in the z direction is changed by applying a writing current in the z direction. The resistance value of the magneto-resistive element 10 in the z direction can be read by applying a reading current to the magneto-resistive element 10 in the z direction.

The magneto-resistive element 10 includes a first ferromagnetic layer 1, a second ferromagnetic layer 2, and a non-magnetic layer 3. The non-magnetic layer 3 is located between the first ferromagnetic layer 1 and the second ferromagnetic layer 2. The magneto-resistive element 10 may have a buffer layer 4, a seed layer 5, a ferromagnetic layer 6, a spacer layer 7, and a magnetic induction layer 8, in addition to these. The buffer layer 4, the seed layer 5, the ferromagnetic layer 6 and the spacer layer 7 are located between the first ferromagnetic layer 1 and the electrode E1, and the magnetic induction layer 8 is located between the second ferromagnetic layer 2 and the electrode E2.

The magneto-resistive element 10 is a laminated body having a columnar shape. A shape of the magneto-resistive element 10 when seen in a plan view in the z direction is not particularly limited. For example, the shape may be a circular shape as shown in FIG. 4 or may be an elliptical shape, an oval shape, or a rectangular shape. A width of the magneto-resistive element 10 is, for example, 10 nm or more and 2000 nm or less, and preferably, 30 nm or more and 500 nm or less.

The first ferromagnetic layer 1 and the second ferromagnetic layer 2 are, for example, vertical magnetization films having easy magnetization axes in the z direction. The first ferromagnetic layer 1 and the second ferromagnetic layer 2 may be in-plane magnetization films having easy magnetization axes in any one direction in the xy plane.

Each of the first ferromagnetic layer 1 and the second ferromagnetic layer 2 includes a ferromagnetic body. For example, the magnetization of the first ferromagnetic layer 1 is more difficult to move than the magnetization of the second ferromagnetic layer 2. When a predetermined external force is applied, an orientation of the magnetization of the first ferromagnetic layer 1 is not changed (fixed), and an orientation of the magnetization of the second ferromagnetic layer 2 is changed. The first ferromagnetic layer 1 is referred to as a magnetization fixing layer. The second ferromagnetic layer 2 is referred to as a magnetization free layer. The magneto-resistive element 10 shown in FIG. 3 has a magnetization fixing layer closer to the substrate Sub than the magnetization free layer, and is referred to as a bottom pin structure. A positional relation between the first ferromagnetic layer 1 and the second ferromagnetic layer 2 may be reversed. A resistance value of the magneto-resistive element 10 is changed according to the change in relative angle between the magnetization of the first ferromagnetic layer 1 and the magnetization of the second ferromagnetic layer 2.

Each of the first ferromagnetic layer 1 and the second ferromagnetic layer 2 is, for example, a metal selected from the group consisting of Cr, Mn, Co, Fe and Ni, an alloy including one or more metals thereof, an alloy including these metals and at least one element of B, C, and N, or the like. Each of the first ferromagnetic layer 1 and the second ferromagnetic layer 2 is, for example, Co—Fe, Co—Fe—B, Ni—Fe, a Co—Ho alloy, a Sm—Fe alloy, a Fe—Pt alloy, a Co—Pt alloy, or CoCrPt alloy.

The first ferromagnetic layer 1 and the second ferromagnetic layer 2 may include a Heusler alloy. The Heusler alloy includes an intermetallic compound having a chemical composition of XYZ or $X_2YZ$. X is a transition metal element or a noble metal element of the Co, Fe, Ni, or Cu groups in the periodic table, Y is a transition metal of the Mn, V, Cr, or Ti groups, or the same types of element as those for X, and Z is a typical element from Group III to Group V. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has high spin polarizability.

Figure 5:
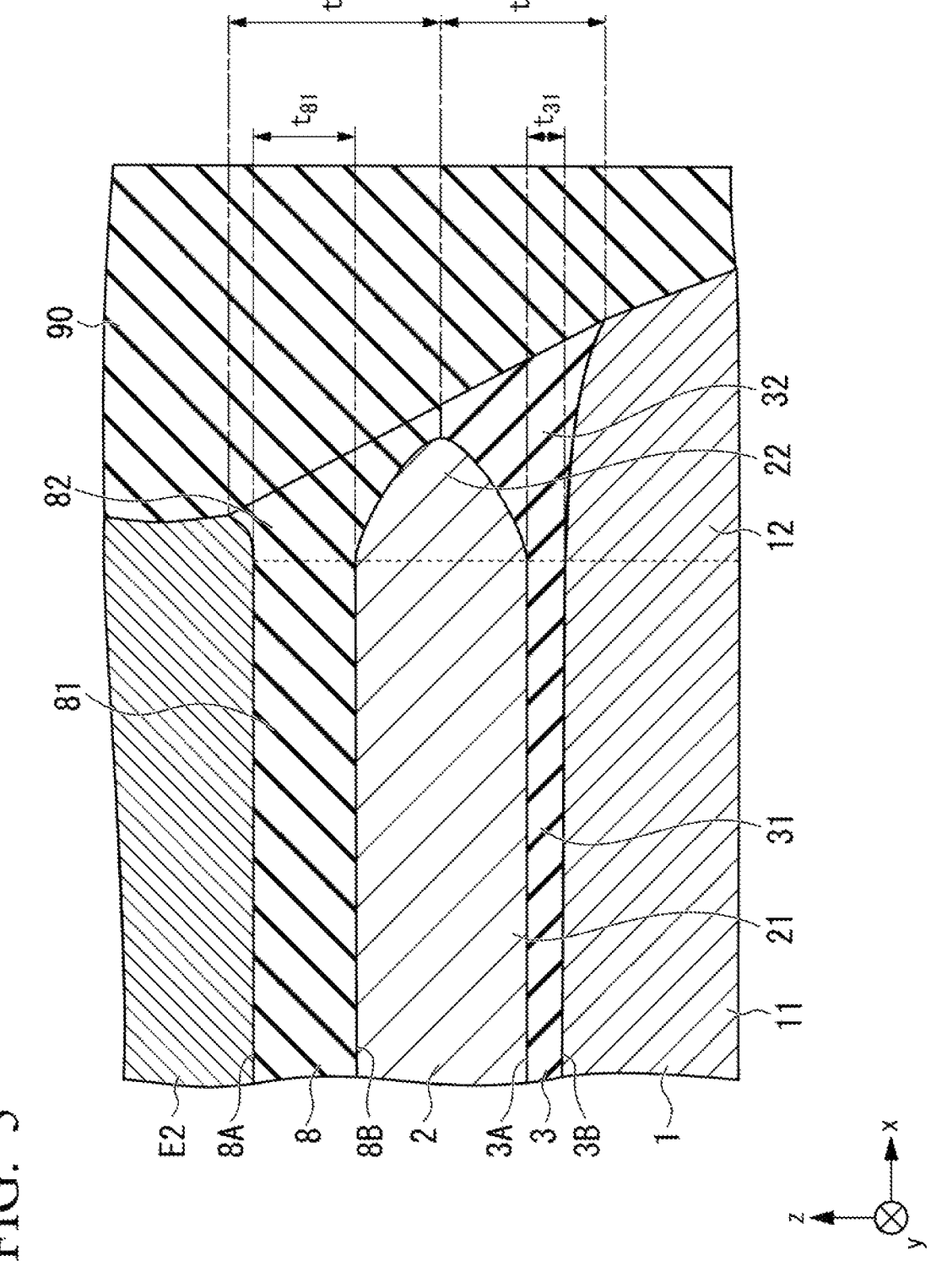
FIG. 5 is an enlarged view of a characteristic portion of the magneto-resistive element according to the first embodiment.

FIG. 5 is an enlarged view of a characteristic portion of the magneto-resistive element 10 according to the first embodiment.

The first ferromagnetic layer 1 includes a central region 11 and an outer circumferential region 12. The outer circumferential region 12 is an outer side of the central region 11. The outer circumferential region 12 is, for example, a region within 10% from an outer side of a width of the first ferromagnetic layer 1 in an xy direction.

An average thickness of the central region 11 is greater than an average thickness of the outer circumferential region 12. The average thickness is an average value of thicknesses measured at five different points in the xy plane. The thickness can be measured by a scanning electron microscope (SEM) or a transmission electron microscope (TEM).

The thickness of the central region 11 is substantially constant in the xy plane. The outer circumferential region 12 narrows outward from an interface between the central region 11 and the outer circumferential region 12. That is, the outer circumferential region 12 has a thickness that is thinned toward the insulating layer 90 from the interface between the central region 11 and the outer circumferential region 12.

The central region 11 is formed of, for example, a material that constitutes the first ferromagnetic layer 1. The outer circumferential region 12 contains, for example, nitrogen, in addition to the material that constitutes the first ferromagnetic layer 1. For example, a nitrogen concentration of the outer circumferential region 12 becomes low as it approaches the central region 11.

Similarly, the second ferromagnetic layer 2 includes a central region 21 and an outer circumferential region 22. The central region 21 is an example of a third central region. The outer circumferential region 22 is an example of a third outer circumferential region. The outer circumferential region 22 is an outer side of the central region 21. The outer circumferential region 22 is, for example, a region within 10% from an outer side of a width of the second ferromagnetic layer 2 in the xy direction.

The average thickness of the central region 21 is greater than the average thickness of the outer circumferential region 22. The thickness of the central region 21 is substantially constant in the xy plane. The outer circumferential region 22 narrows outward from the interface between the central region 21 and the outer circumferential region 22. That is, the outer circumferential region 22 has a thickness that is thinned toward the insulating layer 90 from the interface between the central region 21 and the outer circumferential region 22.

The central region 21 is formed of, for example, a material that constitutes the second ferromagnetic layer 2. The outer circumferential region 22 contains, for example, nitrogen, in addition to the material that constitutes the second ferromagnetic layer 2. For example, a nitrogen concentration of the outer circumferential region 22 become low as it approaches the central region 21.

The non-magnetic layer 3 includes a non-magnetic body. When the non-magnetic layer 3 is an insulating body (a tunnel barrier layer), for example, $Al_2O_3$, $SiO_2$, MgO, and $MgAl_2O_4$, or the like, may be used as the material. In addition to these materials, a material or the like in which some of Al, Si and Mg are substituted with Zn, Be, or the like may also be used. Among these materials, since MgO or $MgAl_2O_4$ is a material that can realize a coherent tunnel, spins can be efficiently injected. When the non-magnetic layer 3 is a metal, Cu, Au, Ag, or the like, may also be used as the material. Further, when the non-magnetic layer 3 is a semiconductor, Si, Ge, $CuInSe_2$, $CuGaSe_2$, $Cu(In, Ga)Se_2$, or the like, may also be used as the material.

The non-magnetic layer 3 contains, for example, MgO or Mg—Al—O as main components. The main component means the one with the largest ratio among the molecules that constitute the non-magnetic layer 3, and for example, occupies 80% or more of the non-magnetic layer 3. Mg—Al—O is an oxide of magnesium and aluminum, and a ratio of Mg and Al can be designed freely.

The non-magnetic layer 3 may include any one or more elements selected from the group consisting of, for example, Ti, Si, Ga, In, Fe, Co, N, and Ta. These elements are included as elements other than the above-mentioned main component, for example. These elements change a lattice constant of the non-magnetic layer 3, and enhances lattice matching between the first ferromagnetic layer 1 and the non-magnetic layer 3 or between the second ferromagnetic layer 2 and the non-magnetic layer 3. When the lattice matching of the interface therebetween is enhanced, electron scattering in the interface can be suppressed, and an MR ratio of the magneto-resistive element 10 is improved.

The non-magnetic layer 3 includes a central region 31 and an outer circumferential region 32. The central region 31 is an example of the first central region. The outer circumferential region 32 is an example of the first outer circumferential region. The outer circumferential region 32 is an outer side of the central region 31. The outer circumferential region 32 is, for example, a region within 10% from an outer side of a width of the non-magnetic layer 3 in the xy direction.

An average thickness $t_{31}$ of the central region 31 is smaller than a maximum thickness $t_{32}$ of the outer circumferential region 32. The maximum thickness $t_{32}$ is, for example, a maximum value of the thickness of the xz cross section in the z direction. The thickness of the central region 31 is substantially constant in the xy plane.

The outer circumferential region 32 spreads outward from the interface between the central region 31 and the outer circumferential region 32. That is, the outer circumferential region 32 has a thickness that is increased toward the insulating layer 90 from the interface between the central region 31 and the outer circumferential region 32. A first surface 3A and a second surface 3B of the non-magnetic layer 3 are separated outward in the outer circumferential region 32.

The central region 31 is formed of, for example, a material that constitutes the non-magnetic layer 3. The outer circumferential region 32 contains, for example, nitrogen, in addition to the material that constitutes the non-magnetic layer 3. For example, a nitrogen concentration of the outer circumferential region 32 becomes low as it approaches the central region 31.

The magnetic induction layer 8 enhances magnetic anisotropy of the second ferromagnetic layer 2. For example, the magnetic induction layer 8 enhances vertical magnetic anisotropy of the second ferromagnetic layer 2. The magnetic induction layer 8 is, for example, a magnesium oxide, W, Ta, Mo, or the like. When the magnetic induction layer 8 is the magnesium oxide, the magnesium oxide is preferably oxygen-deficient in order to increase the conductivity. An average film thickness of the magnetic induction layer 8 is, for example, 0.5 nm or more and 5.0 nm or less.

The magnetic induction layer 8 includes a central region 81 and an outer circumferential region 82. The central region 81 is an example of the second central region. The outer circumferential region 82 is an example of the second outer circumferential region. The outer circumferential region 82 is an outer side of the central region 81. The outer circumferential region 82 is, for example, a region within 10% from an outer side of a width of the magnetic induction layer 8 in the xy direction.

An average thickness $t_{81}$ of the central region 81 is smaller than a maximum thickness $t_{82}$ of the outer circumferential region 82. A thickness of the central region 81 is substantially constant in the xy plane. The outer circumferential region 82 is spread outward from an interface between the central region 81 and the outer circumferential region 82. That is, the outer circumferential region 82 has a thickness that is increased toward the insulating layer 90 from the interface between the central region 81 and the outer circumferential region 82. A first surface 8A and a second surface 8B of the magnetic induction layer 8 are separated outward in the outer circumferential region 82.

The central region 81 is formed of, for example, a material that constitutes the magnetic induction layer 8. The outer circumferential region 82 contains, for example, nitrogen, in addition to the material that constitutes the magnetic induction layer 8. For example, a nitrogen concentration of the outer circumferential region 82 is low as it approaches the central region 81.

The outer circumferential region 32 of the non-magnetic layer 3 and the outer circumferential region 82 of the magnetic induction layer 8 cover, for example, a side surface of the second ferromagnetic layer 2. The second ferromagnetic layer 2 may be configured so as not to be in direct contact with, for example, the insulating layer 90. In this case, the outer circumferential region 32 of the non-magnetic layer 3 or the outer circumferential region 82 of the magnetic induction layer 8 is disposed between the insulating layer 90 and the second ferromagnetic layer 2.

The buffer layer 4 and the seed layer 5 are referred to as a based layer. The buffer layer 4 is a layer that attenuates lattice mismatch between different crystals. The buffer layer 4 is, for example, a metal containing at least one element selected from the group consisting of Ta, Ti, Zr and Cr, or a nitride containing at least one element selected from the group consisting of Ta, Ti, Zr and Cu. More specifically, the buffer layer 4 is, for example, Ta (simple substance), TaN (tantalum nitride), CuN (copper nitride), TiN (titanium nitride), or NiAl (nickel aluminum). A film thickness of the buffer layer 4 is, for example, 1 nm or more and 5 nm or less. The buffer layer 4 is, for example, amorphous. The buffer layer 4 is located, for example, between the seed layer 5 and the electrode E1, and comes into contact with the electrode E1. The buffer layer 4 prevents the crystal structure of the electrode E1 from affecting the crystal structure of the first ferromagnetic layer 1.

The seed layer 5 increases crystallinity of layers laminated on the seed layer 5. The seed layer 5 is located, for example, between the buffer layer 4 and the ferromagnetic layer 6, and on the buffer layer 4. When the ferromagnetic layer 6 and the spacer layer 7 are not provided, the seed layer 5 is located, for example, between the buffer layer 4 and the first ferromagnetic layer 1. The seed layer 5 is, for example, a compound having a (001) oriented NaCl structure. The seed layer 5 is, for example, Pt, Ru, Zr, NiCr alloy, or NiFeCr. A film thickness of the seed layer 5 is, for example, 1 nm or more and 5 nm or less.

The ferromagnetic layer 6 is magnetically coupled to, for example, the first ferromagnetic layer 1. The magnetic coupling is, for example, anti-ferromagnetic coupling, and generated by an RKKY interaction. An orientation of the magnetization of the first ferromagnetic layer 1 and an orientation of the magnetization of the ferromagnetic layer 6 are anti-parallel. The material that constitutes the ferromagnetic layer 6 is the same as, for example, the first ferromagnetic layer 1. The ferromagnetic layer 6, the spacer layer 7, and the first ferromagnetic layer 1 have a synthetic anti-ferromagnetic structure (SAF structure). The synthetic anti-ferromagnetic structure is constituted by two magnetic layers sandwiching a non-magnetic layer. Since the first ferromagnetic layer 1 and the ferromagnetic layer 6 are anti-ferromagnetically coupled, the coercive force of the first ferromagnetic layer 1 is greater than when the ferromagnetic layer 6 is not provided.

The spacer layer 7 is located between the first ferromagnetic layer 1 and the ferromagnetic layer 6. The spacer layer 7 is also referred to as a magnetic coupling layer. The spacer layer 7 is, for example, Ru, Ir, or the like.

The insulating layer 90 covers surroundings of the magneto-resistive element 10. The insulating layer 90 may have a plurality of layers from a side close to the side surface of the magneto-resistive element 10. The side surface of the insulating layer 90 in contact with the laminated body contains, for example, nitrogen. The insulating layer 90 may have a nitride layer in contact with the side surface of the magneto-resistive element 10 and an oxide layer that sandwiches the nitride layer together with the magneto-resistive element 10. For example, the nitride layer is a silicon nitride, and the oxide layer is a silicon oxide.

Next, a method of manufacturing the magneto-resistive element 10 will be described. The method of manufacturing the magneto-resistive element 10 includes a laminating process, a etching process, an exposing process, an insulating layer forming process, and an annealing process.

In the laminating process, layers that become the magneto-resistive element 10 are laminated. For example, the buffer layer 4, the seed layer 5, the ferromagnetic layer 6, the spacer layer 7, the first ferromagnetic layer 1, the non-magnetic layer 3, the second ferromagnetic layer 2, and the magnetic induction layer 8 are laminated in sequence from a side near the substrate Sub. Lamination of the layers can use a sputtering method, a chemical vapor deposition (CVD) method, an electron beam deposition method (EB deposition method), an atom laser deposition method, or the like.

In the laminating process, a laminated film including at least the first ferromagnetic layer 1, the non-magnetic layer 3, and the second ferromagnetic layer 2 is formed. When the non-magnetic layer 3 and the magnetic induction layer 8 are oxide films, these layers may be in an oxygen deficiency state, and when the non-magnetic layer 3 and the magnetic induction layer 8 are nitride films, these layers may be in a nitrogen deficiency state.

Next, in the etching process, the laminated film is processed in a predetermined shape. Processing of each layer may be performed through etching or the like using, for example, a photolithography method. The etching is performed using, for example, an ion beam, argon gas, or the like. The laminated film is a laminated body having a columnar shape.

Next, in the exposing process, the side surface of the laminated body is exposed to an oxygen or nitrogen gas atmosphere. The laminating process and the etching process are generally performed in a vacuum state, oxygen or nitrogen gas is supplied into a furnace. The oxygen or nitrogen adheres to the side surface of the laminated body.

Next, in the insulating layer forming process, the side surface of the laminated body is covered with the insulating layer. The insulating layer is fabricated by a sputtering method, a chemical vapor deposition (CVD) method, an electron beam deposition method (EB deposition method), an atom laser deposition method, or the like.

Next, in the annealing process, the laminated body and the insulating layer are annealed. When annealed, the oxygen or nitrogen adhered to the non-magnetic layer 3 and the magnetic induction layer 8 is incorporated in the non-magnetic layer 3 and the magnetic induction layer 8. When the oxygen or nitrogen is incorporated in the non-magnetic layer 3 and the magnetic induction layer 8, a lattice constant is increased and a volume is increased in a portion in which the oxygen or nitrogen is incorporated. As a result, an outer circumferential region is wider than a central region. When the non-magnetic layer 3 and the magnetic induction layer 8 are left in a deficient state, the oxygen or nitrogen is likely to be incorporated inside.

In the magneto-resistive element 10 according to the embodiment, the non-magnetic layer 3 covers a part of the side surface of the second ferromagnetic layer 2. For this reason, it is difficult to short-circuit the first ferromagnetic layer 1 and the second ferromagnetic layer 2. The first ferromagnetic layer 1 and the second ferromagnetic layer 2 may be short-circuited, for example, by partially reattaching to the ferromagnetic layer or the wiring removed during manufacturing.

When the first ferromagnetic layer 1 and the second ferromagnetic layer 2 are short-circuited, a current path that does not go through the non-magnetic layer 3 is formed. In this case, miswriting of the data may occur, unexpected elimination or the like of the recorded data may occur, and thus, reliability of the magneto-resistive element 10 is decreased. The magneto-resistive element 10 according to the embodiment is excellent in reliability because the first ferromagnetic layer 1 and the second ferromagnetic layer 2 are less likely to be short-circuited.

In addition, when the magneto-resistive element 10 according to the embodiment has the magnetic induction layer 8, and the magnetic induction layer 8 and the non-magnetic layer 3 cover the side surface of the second ferromagnetic layer 2, it is more difficult to short-circuit the first ferromagnetic layer 1 and the second ferromagnetic layer 2.

In addition, the magneto-resistive element 10 according to the embodiment can avoid the loss of energy due to the current path not passing through the non-magnetic layer 3, and can suppress the inversion current density for inverting the magnetization of the ferromagnetic layer.

Second Embodiment

Figure 6:
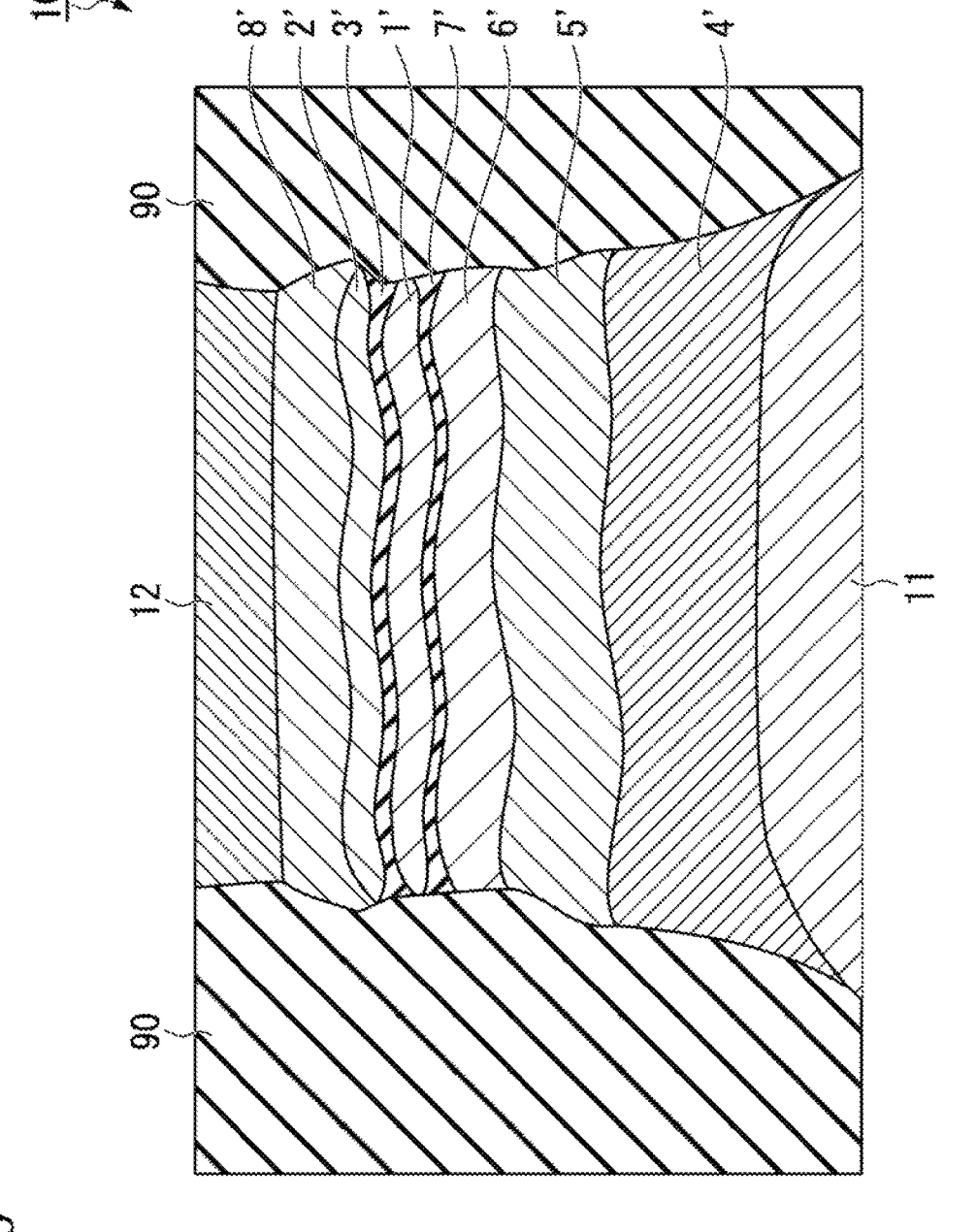
FIG. 6 is a cross-sectional view of a magneto-resistive element according to a second embodiment.

FIG. 6 is a cross-sectional view of a magneto-resistive element 10' according to a second embodiment. FIG. 6 shows a cross section obtained by cutting the magneto-resistive element 10' along the xz plane passing through a center of the magneto-resistive element 10'.

The magneto-resistive element 10' includes a first ferromagnetic layer 1', a second ferromagnetic layer 2', and a non-magnetic layer 3'. The magneto-resistive element 10' may have a buffer layer 4', a seed layer 5', a ferromagnetic layer 6', a spacer layer 7', and a magnetic induction layer 8', in addition to these.

The first ferromagnetic layer 1' corresponds to the first ferromagnetic layer 1 according to the first embodiment. The second ferromagnetic layer 2' corresponds to the second ferromagnetic layer 2 according to the first embodiment. The non-magnetic layer 3' corresponds to the non-magnetic layer 3 according to the first embodiment. The buffer layer 4' corresponds to the buffer layer 4 according to the first embodiment. The seed layer 5' corresponds to the seed layer 5 according to the first embodiment. The ferromagnetic layer 6' corresponds to the ferromagnetic layer 6 according to the first embodiment. The spacer layer 7' corresponds to the spacer layer 7 according to the first embodiment. The magnetic induction layer 8' corresponds to the magnetic induction layer 8 according to the first embodiment. In the configuration of each layer, description of the same configuration as the layer corresponding to the first embodiment will be omitted. That is, each layer of the first ferromagnetic layer 1', the second ferromagnetic layer 2', the non-magnetic layer 3', the buffer layer 4', the seed layer 5', the ferromagnetic layer 6', the spacer layer 7', and the magnetic induction layer 8' may select the configuration according to the first embodiment.

Figure 7:
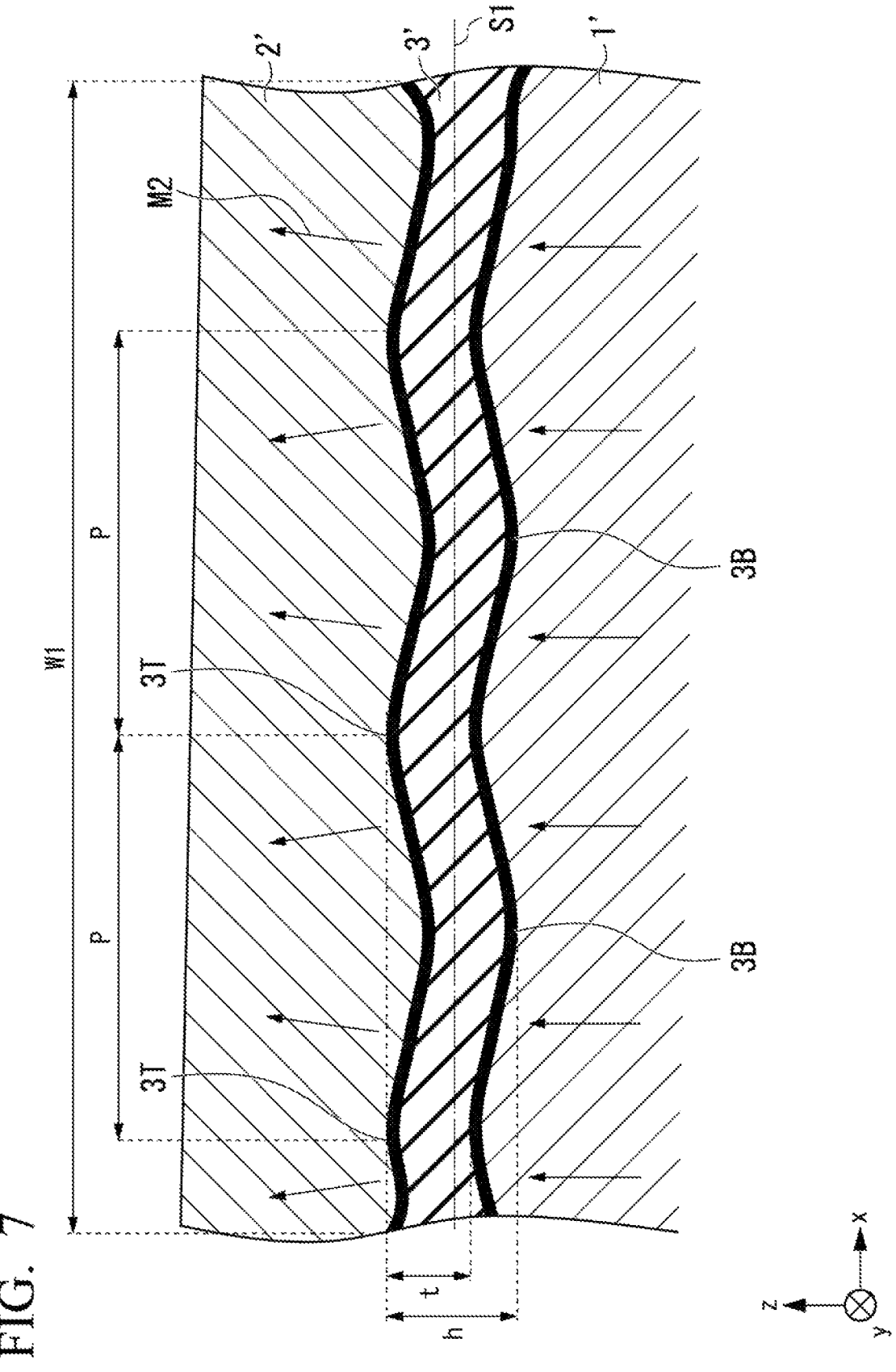
FIG. 7 is an enlarged view of a characteristic portion of the magneto-resistive element according to the second embodiment.

FIG. 7 is an enlarged view of a characteristic portion of the magneto-resistive element 10' according to the second embodiment. The non-magnetic layer 3' is undulating with respect to a reference surface S1. The reference surface S1 is a surface spreading in the xy plane passing through a middle point between a highest point and a lowest point of the non-magnetic layer 3' in the z direction and perpendicular to the laminating direction. Undulating with respect to the reference surface S1 means that an upward convex portion and a downward convex portion with respect to the reference surface S1 are alternately arranged in one direction. An upper surface of the non-magnetic layer 3' has an upward convex portion and a downward convex portion alternately, and a lower surface of the non-magnetic layer 3' also has an upward convex portion and a downward convex portion alternately. The non-magnetic layer 3' includes a first central region and a first outer circumferential region that is an outer side of the first central region, and a maximum thickness of the first outer circumferential region is greater than an average thickness of the first central region.

The non-magnetic layer 3' has the upward convex portion and the downward convex portion with respect to the reference surface S1 that are periodically arranged in one direction. A period p of the undulation of the non-magnetic layer 3' is preferably 30% of a width W1 of the non-magnetic layer 3' or less. The period p of the undulation of the non-magnetic layer 3' is preferably, for example, 30 nm or less. When the condition is satisfied, the inversion current density required to invert the magnetization of the second ferromagnetic layer 2' can be lowered especially.

The period p can be obtained as an average value of distances between peaks of the convex portions protruding upward from the reference surface S1. The average value of the distances between the peaks of the convex portions is obtained by obtaining each of the distances between peaks 2T of the adjacent convex portions and calculating the average value. A distance between peaks 3T of the adjacent convex portions can be measured by, for example, a scanning electron microscope. The period p may be obtained as an average value of distances between peaks 3B of the convex portions protruding downward from the reference surface S1.

The non-magnetic layer 3' has, for example, undulation of two periods or more in any one direction of the xy plane. For example, the width W1 of the non-magnetic layer 3' is preferably two periods ($2p$) or more of the undulation. A width of the non-magnetic layer 3' in the major axis direction when seen in a plan view is preferably, for example, two periods ($2p$) or more of the undulation. When the condition is satisfied, the inversion current density required to invert the magnetization of the second ferromagnetic layer 2' can be lowered especially.

A difference h in height between the highest point and the lowest point of the non-magnetic layer 3' is, for example, two times of a film thickness t of the non-magnetic layer 3' or less. The difference h in height between the highest point and the lowest point of the non-magnetic layer 3' is a vertical height drawn from the highest point in the z direction to a surface extending in the xy plane through the lowest point in the z direction. The film thickness t of the non-magnetic layer 3' is an average value of the film thickness of the non-magnetic layer 3' measured at different 10 points in the xy plane. The difference h in height between the highest point and the lowest point of the non-magnetic layer 3' and the film thickness t of the non-magnetic layer 3' can be measured by a scanning electron microscope. The film thickness t of the non-magnetic layer 3' is, for example, 0.5 nm or more and 10.0 nm or less, and 1.0 nm or more and 5.0 nm or less.

When the height of the undulation of the non-magnetic layer 3' is within the range, a degree of an inclination of magnetization M2 of the second ferromagnetic layer 2' with respect to the z direction is within a predetermined range. When the inclination of the magnetization M2 of the second ferromagnetic layer 2' is within the predetermined range, a decrease in MR ratio of the magneto-resistive element 10' can be suppressed.

In the magneto-resistive element 10', each layer other than the non-magnetic layer 3' may be undulated with respect to the surface parallel to the reference surface S1, like the non-magnetic layer 3'.

For example, each of the first ferromagnetic layer 1' and the second ferromagnetic layer 2' may be undulated with respect to the surface parallel to the reference surface S1. The period of the undulation of the first ferromagnetic layer 1' and the second ferromagnetic layer 2' substantially coincides with the period of the undulation of the non-magnetic layer 3'. The height of the undulation of the first ferromagnetic layer 1' and the second ferromagnetic layer 2' substantially coincides with the height of the undulation of the non-magnetic layer 3'. Each of the first ferromagnetic layer 1' and the second ferromagnetic layer 2' reflects, for example, the shape of the non-magnetic layer 3'.

In addition, for example, the layer located between the based layer (the buffer layer 4' and the seed layer 5') and the first ferromagnetic layer 1' (for example, the ferromagnetic layer 6', the spacer layer 7') may be undulated with respect to the surface parallel to the reference surface S1. The period of the undulation of these layers substantially coincides with the period of the undulation of the non-magnetic layer 3'. Each of these layers reflects, for example, the shape of the non-magnetic layer 3'.

The undulation of the non-magnetic layer 3' is formed by forming unevenness on the surface of the buffer layer 4' and depositing each layer to follow the unevenness. The unevenness on the surface of the buffer layer 4' can be formed by controlling a condition of chemical mechanical polishing (CMP). The condition of the chemical mechanical polishing differs depending on a pressure of chemical mechanical polishing, a time of chemical mechanical polishing, a type of a polishing agent, a material that constitutes the buffer layer 4', and a material that constitutes the insulating layer 90. The period, the height, or the like, of the unevenness formed on the buffer layer 4' can be adjusted by changing those conditions.

The condition of the CMP polishing fluctuates depending on device dependence, a type of a polishing agent, a material that constitutes the buffer layer 4', a material that constitutes the insulating layer 90, a polishing pressure, and a polishing time. For this reason, the condition of the CMP polishing is determined in advance by outputting the condition a plurality of times and performing feedback a plurality of times. The condition of the CMP polishing is obtained by conducting a preliminary study by changing these parameters using samples fabricated under the same conditions. When the CMP polishing is performed under the same condition with respect to the samples fabricated in the same condition, a surface state of the buffer layer 4' can be controlled with good reproducibility.

Then, the seed layer 5', the ferromagnetic layer 6', the spacer layer 7', the first ferromagnetic layer 1', the non-magnetic layer 3', the second ferromagnetic layer 2', and the magnetic induction layer 8' are formed in sequence on the buffer layer 4' on which the CMP polishing was performed. Each of these layers follows and curves the surface shape of the buffer layer 4'. As a result, each of these layers has an undulating shape with respect to a flat surface extending in an in-plane direction.

Like the magneto-resistive element 10 according to the first embodiment, in the magneto-resistive element 10' according to the second embodiment, an outer thickness of the non-magnetic layer 3 is thicker than an inner thickness, and the first ferromagnetic layer 1 and the second ferromagnetic layer 2 are difficult to short-circuit. For this reason, the magneto-resistive element 10' is excellent in reliability.

In addition, in the magneto-resistive element 10' according to the second embodiment, since the non-magnetic layer 3' is undulating, the inversion current density required to invert the magnetization of the second ferromagnetic layer 2' can be lowered. This is probably because the magnetization of the second ferromagnetic layer 2' is slightly inclined along the surface of the non-magnetic layer 3'.

As shown in FIG. 7, the magnetization M2 of the second ferromagnetic layer 2' is oriented perpendicular to the surface of the non-magnetic layer 3'. The magnetization M2 is inclined with respect to the z direction. The magnetization M2 is inverted while performing precession when spins are injected from the first ferromagnetic layer 1'. When the magnetization M2 is inclined in an initial state, the magnetization M2 becomes easier to perform precession for magnetization inversion, and energy required for magnetization inversion becomes smaller. As a result, it is conceivable that the magneto-resistive element 10' according to embodiment can reduce the inversion current density required to invert the magnetization of the second ferromagnetic layer 2'.

Figure 8:
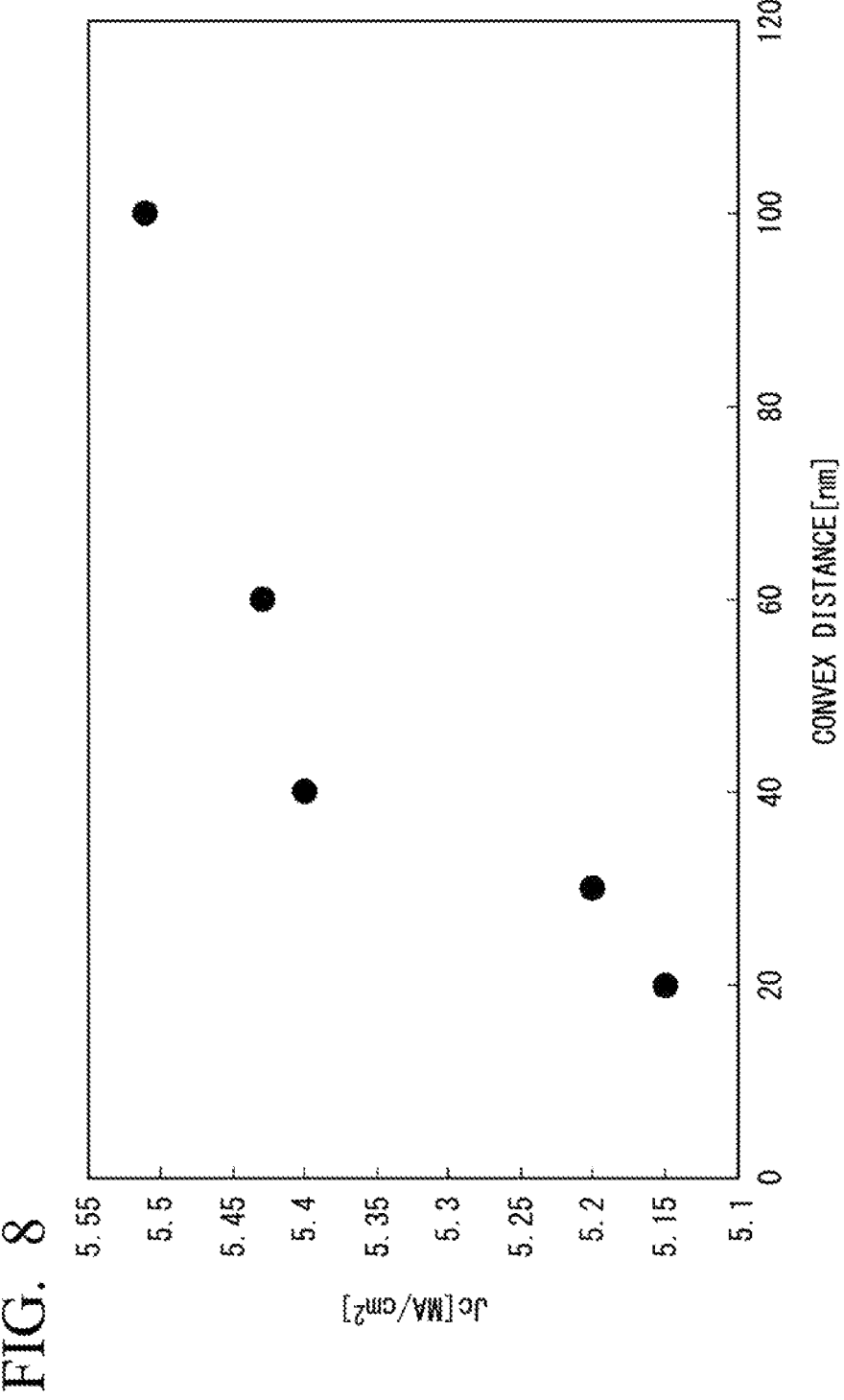
FIG. 8 shows results of Examples 1 to 4 and Comparative example 1.

FIG. 8 shows results of Examples 1 to 4 and Comparative example 1 for confirming the above-mentioned assumption.

Example 1

A magneto-resistive element with a diameter of 100 nm was fabricated. The magneto-resistive element has a buffer layer (TiN), a seed layer (NiCr alloy), a ferromagnetic layer (CoFe alloy), a magnetic coupling layer (Ru), a first ferromagnetic layer (CoFe alloy), a non-magnetic layer (MgO), a second ferromagnetic layer (CoFe alloy), and a magnetic induction layer (MgO) in sequence from a side near a substrate. After forming the buffer layer, the surface was CMP-polished, and unevenness was fabricated on the surface of the buffer layer. The non-magnetic layer was undulated according to the unevenness of the buffer layer. A period of the undulation of the non-magnetic layer was 20 nm.

An inversion current density was measured using the fabricated magneto-resistive element of Example 1. The inversion current density of Example 1 was 5.15 MA/cm².

Examples 2 to 4

Examples 2 to 4 are distinguished from Example 1 in that the period of the undulation of the non-magnetic layer was changed. The period of the undulation of the non-magnetic layer was changed by changing a condition when the buffer layer was CMP-polished. The period of the undulation of Example 2 was 30 nm, the period of the undulation of Example 3 was 40 nm, and the period of the undulation of Example 4 was 60 nm. Then, the inversion current density was measured using the magneto-resistive element of each of Examples 2 to 4.

Comparative Example 1

Comparative example 1 is distinguished from Example 1 in that the non-magnetic layer is flat. The non-magnetic layer was flattened by changing the condition when the buffer layer is CMP-polished and flattening the surface of the buffer layer. The inversion current density was measured using the magneto-resistive element of Comparative example 1.

In FIG. 8, since Comparative example 1 has no undulation, a distance of a convex portion is expressed as a width (100 nm) of the magneto-resistive element. As shown in FIG. 8, when the non-magnetic layer 3' is undulated, the inversion current density of the magneto-resistive element was reduced. In addition, when the period of the undulation is 30% of the width of the magneto-resistive element or less, the inversion current density of the magneto-resistive element was reduced especially.

Hereinabove, while the magneto-resistive element 10 according to the first embodiment and the magneto-resistive element 10' according to the second embodiment have been exemplarily described, additions, omissions, substitutions and other modifications of the components may be made without departing from the spirit of the present invention.

Figure 9:
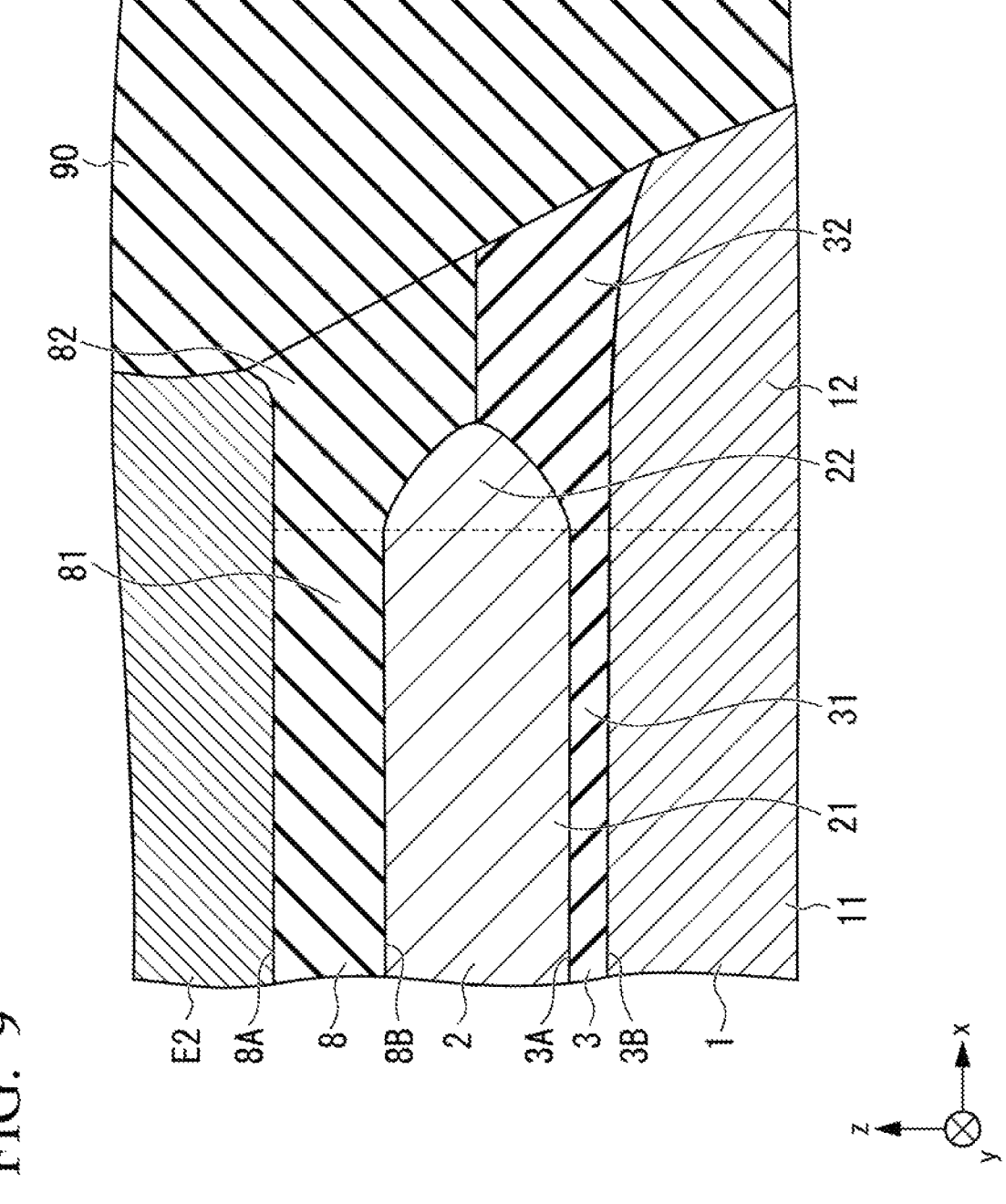
FIG. 9 is an enlarged view of a characteristic portion of the magneto-resistive element according to the first modification.

For example, FIG. 9 is an enlarged view of a characteristic portion of the magneto-resistive element according to the first modification. FIG. 9 is a modification of FIG. 5. The first modification in FIG. 9 differs from the first embodiment in FIG. 5 in that the second ferromagnetic layer 2 is inside the top surface of the magneto-resistive element 10 when viewed in plan from the z direction. The second ferromagnetic layer 2 is placed inside the magneto-resistive element 10 to better prevent a short circuit of the second ferromagnetic layer 2 with the first ferromagnetic layer 1 or electrode E2. Similarly in the second embodiment, the second ferromagnetic layer 2' may be located more inwardly of the magneto-resistive element 10'.

Here, while the example in which the magneto-resistive elements 10 or the magneto-resistive element 10' is applied to the magnetic memory 100 has been described, it is not limited to the example. For example, the magneto-resistive element 10 or the magneto-resistive element 10' may be used in a magnetic head, a magnetic sensor, or the like.

EXPLANATION OF REFERENCES

1, 1' First ferromagnetic layer
2, 2' Second ferromagnetic layer
3, 3' Non-magnetic layer
3A, 8A First surface
3B, 8B Second surface
4, 4' Buffer layer
5, 5' Seed layer
6, 6' Ferromagnetic layer
7, 7' Spacer layer
8, 8' Magnetic induction layer
10, 10' Magneto-resistive element
11, 21, 31, 81 Central region
12, 22, 32, 82 Outer circumferential region
90 Insulating layer
100 Magnetic memory

What is claimed is:

1. A magneto-resistive element comprising: a first ferromagnetic layer, a second ferromagnetic layer, and a non-magnetic layer, wherein the non-magnetic layer is located between the first ferromagnetic layer and the second ferromagnetic layer, the non-magnetic layer includes a first central region, and a first outer circumferential region disposed on an outer side of the first central region; and a maximum thickness of the first outer circumferential region is greater than an average thickness of the first central region, the first outer circumferential region contains nitrogen, the first outer circumferential region has a first portion and a second portion that is located farther from the first central region than the first portion, and the nitrogen concentration in the first portion is lower than the nitrogen concentration in the second portion, and the nitrogen concentration gradually decreases from the second portion to the first portion.

2. The magneto-resistive element according to claim 1, wherein the first outer circumferential region has a thickness that increases outward from an interface between the first central region and the first outer circumferential region.

3. The magneto-resistive element according to claim 1, further comprising: a magnetic induction layer, wherein the magnetic induction layer and the non-magnetic layer sandwich the second ferromagnetic layer, the magnetic induction layer includes a second central region, and a second outer circumferential region disposed on an outer side of the second central region, and a maximum thickness of the second outer circumferential region is greater than an average thickness of the second central region.

4. The magneto-resistive element according to claim 3, wherein the second outer circumferential region has a thickness that is increased outward from an interface between the second central region and the second outer circumferential region.

5. The magneto-resistive element according to claim 3, wherein the second outer circumferential region contains nitrogen.

6. The magneto-resistive element according to claim 1, wherein the second ferromagnetic layer includes a third central region, and a third outer circumferential region disposed on an outer side of the third central region, and an average thickness of the third outer circumferential region is smaller than an average thickness of the third central region.

7. The magneto-resistive element according to claim 6, wherein the third outer circumferential region has a thickness that reduces outward from an interface between the third central region and the third outer circumferential region.

8. The magneto-resistive element according to claim 1, further comprising: an insulating layer configured to cover a side surface of a laminated body including the first ferromagnetic layer, the second ferromagnetic layer and the non-magnetic layer, wherein the insulating layer contains nitrogen in a region in contact with the laminated body.

9. The magneto-resistive element according to claim 8, wherein the non-magnetic layer contains at least one element selected from the group consisting of Ti, Si, Ga, In, Fe, Co, N, and Ta.

10. The magneto-resistive element according to claim 1, wherein the non-magnetic layer contains MgO or Mg—Al—O as a main component.

11. A magneto-resistive element comprising: a first ferromagnetic layer, a second ferromagnetic layer, a non-magnetic layer and a magnetic induction layer, wherein the non-magnetic layer is located between the first ferromagnetic layer and the second ferromagnetic layer, the non-magnetic layer includes a first central region, and a first outer circumferential region disposed on an outer side of the first central region; and a maximum thickness of the first outer circumferential region is greater than an average thickness of the first central region, the magnetic induction layer and the non-magnetic layer sandwich the second ferromagnetic layer, the magnetic induction layer includes a second central region, and a second outer circumferential region disposed on an outer side of the second central region, a maximum thickness of the second outer circumferential region is greater than an average thickness of the second central region, and the second outer circumferential region contains nitrogen.

12. The magneto-resistive element according to claim 11, wherein the first outer circumferential region has a thickness that increases outward from an interface between the first central region and the first outer circumferential region.

13. The magneto-resistive element according to claim 11, wherein the first outer circumferential region contains nitrogen.

14. The magneto-resistive element according to claim 11, wherein the second outer circumferential region has a thickness that is increased outward from an interface between the second central region and the second outer circumferential region.

15. The magneto-resistive element according to claim 11, wherein the second ferromagnetic layer includes a third central region, and a third outer circumferential region disposed on an outer side of the third central region, and an average thickness of the third outer circumferential region is smaller than an average thickness of the third central region.

16. The magneto-resistive element according to claim 15, wherein the third outer circumferential region has a thickness that reduces outward from an interface between the third central region and the third outer circumferential region.

17. The magneto-resistive element according to claim 11, further comprising: an insulating layer configured to cover a side surface of a laminated body including the first ferromagnetic layer, the second ferromagnetic layer and the non-magnetic layer, wherein the insulating layer contains nitrogen in a region in contact with the laminated body.

18. The magneto-resistive element according to claim 17, wherein the non-magnetic layer contains at least one element selected from the group consisting of Ti, Si, Ga, In, Fe, Co, N, and Ta.

19. The magneto-resistive element according to claim 11, wherein the non-magnetic layer contains MgO or Mg—Al—O as a main component.

* * * * *